United States Patent
Ema

[19]

[11] Patent Number: 6,034,376
[45] Date of Patent: Mar. 7, 2000

[54] ELECTRON-BEAM EXPOSURE SYSTEM AND A METHOD APPLIED THEREIN

[75] Inventor: Takahiro Ema, Tokyo, Japan

[73] Assignee: NEC Corporation, Tokyo, Japan

[21] Appl. No.: 09/035,835

[22] Filed: Mar. 6, 1998

[30] Foreign Application Priority Data

Mar. 7, 1997 [JP] Japan ..................................... 9-053259

[51] Int. Cl.[7] ............................. H01J 37/04; H01J 37/302
[52] U.S. Cl. ............................... 250/492.23; 250/492.22; 250/505.1; 430/5; 430/296
[58] Field of Search ..................... 250/492.23, 492.22, 250/492.2, 505.1; 430/5, 296

[56] References Cited

U.S. PATENT DOCUMENTS

| 5,334,282 | 8/1994 | Nakayama et al. | 250/492.23 |
| 5,895,736 | 4/1999 | Nakajima | 250/492.23 |

FOREIGN PATENT DOCUMENTS

| 63-88737 | 4/1988 | Japan . |
| 4-137520 | 5/1992 | Japan . |

OTHER PUBLICATIONS

Hiroshi Yamashita et al., "Coulomb Interaction Effect in Cell Projection Lithography", *Jpn. J. Appl. Phys.*, vol. 34, Part 1, No. 12B, Dec. 1995, pp. 6684–6688.
Partial English Translation of Japanese Patent Office Action dated Jul. 6, 1999.

*Primary Examiner*—Jack I. Berman
*Attorney, Agent, or Firm*—Sughrue, Mion, Zinn, Macpeak & Seas, PLLC

[57] ABSTRACT

To provide an electron-beam exposure system and a method applied therein for enabling control of an electron-beam current to be probed on a wafer surface at a fixed value using a simple process and without needing to prepare various shot sizes or changing emission current of the electron-beam source, the electron-beam exposure system comprises a beam-current adjustment filter having a number of electron-beam absorbent membranes positioned in a path of an electron-beam projected through one of a number of cell patterns used for cell projection lithography. Beam absorption coefficients of the electron-beam absorbent membranes are prepared to give a fixed current intensity of the electron-beam for each of the cell patterns and are determined by considering open space of the cell patterns.

12 Claims, 10 Drawing Sheets ion-beam exposure system and a method applied therein, and particularly, for example, to those applied in a cell projection lithography wherein a desired semiconductor device pattern is divided into several cells and each of the cells is exposed shot by shot.

ELECTRON-BEAM EXPOSURE SYSTEM AND A METHOD APPLIED THEREIN

BACKGROUND OF THE INVENTION

The present invention relates to an electron-beam exposure system and a method applied therein, and particularly, for example, to those applied in a cell projection lithography wherein a desired semiconductor device pattern is divided into several cells and each of the cells is exposed shot by shot.

Recently, high throughput has been pursued in fabrication processes of semiconductor devices, such as memory chips, by using an electron-beam (hereafter abbreviated (EB)) lithography process for printing a fine pattern on a semi-conductor wafer. For enabling the high throughput, the cell projection lithography is used, making use of EB masks where desired cell patterns are prepared.

In cell projection lithography, open space of each cell pattern of the EB mask differs according to each pattern design to be printed on the cell in question, and consequently, current intensity of the electron beam attaining through the EB mask to the object material, such as a semiconductor wafer, varies according to the open space of the selected cell pattern.

This variation of the EB current intensity affects focusing of the electron beam. FIG. 8 is a schematic diagram illustrating the focus deviation according to the EB current intensity.

The larger the open space of the cell pattern is, the higher the EB current intensity becomes. When a cell pattern A of an EB mask 701 has a large open space and cell patterns B and C have a medium and a small open space, respectively, the EB current intensity of an electron beam 702 passing through the cell pattern A is higher than that passing through the cell pattern B and forces called the Coulomb effect, operating among electrons in the electron beam, become stronger, which makes a focusing beam 703a, corresponding to the cell pattern A focused on a wafer 704, wider than a focusing beam 703b, corresponding to the cell pattern B, thus resulting in out of focus printing on surface of the wafer 704, as shown in FIG. 8.

On the other hand, the EB current intensity of the electron beam 702 passing through the cell pattern C becomes lower than that passing through the cell pattern B, and a focusing beam 703c, due to corresponding to the cell pattern C, is narrower than 703b by the Coulomb effect, resulting also in out of focus printing.

Therefore, each time a different cell pattern is selected, the lens system is re-adjusted conventionally, to make the electron beam focus correctly. That is, by measuring beforehand the EB current intensity reaching the wafer for each cell pattern of the EB mask, dynamic focus lenses are controlled for each cell pattern so that the electron beam may focus just on the wafer surface.

However, as reported in "Coulomb Interaction Effect in Cell Projection Lithography" by Yamashita et al., Jpn. J. Appl. Phys. Vol. 34 (1995) pp. 6684–6688, there is a problem in that the pattern resolution becomes degraded according to increase of the EB current because of aberration, for example, chromatic aberration, which becomes large along with the EB current and cannot be compensated for with focus control by way of lenses.

FIG. 9 is a characteristic chart illustrating a relationship between pattern resolution limit, represented by Lines-and-Spaces (L/S) size, and the EB current. It can be seen from FIG. 9 that the pattern resolution depends on the EB current intensity and maximum EB current is limited according to necessary resolution.

To eliminate this problem, there is a method to limit current intensity of electron beams passing through cell patterns by preparing an area (size) of each of the cell patterns to have the same open space, considering each pattern design to be printed.

Although it is not intended to be applied to the cell projection lithography, there is another method proposed for maintaining the EB current intensity within a fixed value by controlling emission current of the electron-beam source, in a Japanese patent application laid open as a Provisional Publication No. 88737/'88, wherein the emission current is feed-back-controlled by a monitoring current flowing through a filter provided on a beam axis of the electron-beam source.

FIG. 10 is a schematic diagram illustrating application of the prior method to the cell projection lithography.

An electron beam 902 radiated from an EB source 901 passes through a cell pattern of an EB mask 903 and is irradiated on a wafer 905 through a filter 904 provided for detecting current flowing through it in proportion with the EB current. When the electron beam 902 passes a cell pattern A having a large open space, the detected current should become large, with which the emission current of the EB source 901 is decreased to give the same EB current intensity.

Such as in the prior arts above described, by controlling projection cell sizes or the emission current, current intensity of the electron beams irradiated on the object material can be controlled within a fixed value, without needing to re-adjust lens system for each of the cell patterns.

However, in the method of controlling projection cell sizes according to the rate of open space of each cell pattern, a fairly large number of shots may be needed because of cell patterns are divided for limiting open space of a light pattern, resulting in degradation of the throughput not to mention the intricate processes required by various sizes of cell patterns included in a mask pattern.

As to the method of controlling the emission current for each cell pattern, the emission current should be changed each time a cell pattern having different open space is selected. A certain standby time is needed until the beam current is stabilized, resulting also in degradation of the throughput per time, even if each EB current monitoring process may economized by beforehand measuring the EB current for each cell pattern.

SUMMARY OF THE INVENTION

Therefore, a primary object of the present invention is to provide an electron-beam exposure system and a method applied therein for enabling to control the EB current to be probed on a wafer surface into a fixed value with a simple process, and without needing to prepare various shot sizes or changing the emission current of the electron-beam source.

In order to achieve the object, an electron-beam exposure system of the invention, having an electron-beam mask including a plurality of cell patterns used for cell projection lithography, comprises:

a best-current adjustment filter having a holder provided with certain numbers of block filters each having an electron-beam absorbent membrane;

a block-filter selection means for selecting at least one of the block filters to be positioned in a path of an electron-beam projected through one of the plurality of cell patterns and irradiated on an object material, a beam-current absorption coefficient of the electron-beam absorbent membrane of each of said at least one of the block filters giving, in total, a substantially fixed current intensity of the electron-beam irradiated on the object material by being prepared considering open space of said one of the plurality of cell patterns.

Therefore, the electron-beam current to be probed on a wafer surface can be controlled into the fixed value with a simple process, without needing to prepare various shot sizes or changing the emission current of the electron-beam source, while realizing a high-quality cell projection lithography with the stable and, plus constant EB current and a high throughput without needing standby time for the beam-current stabilization or the cell pattern dividing.

The beam-current, adjustment filter may be integrated in the electron-bean mask by configuring the electron-beam absorbent membranes to traverse open space of the plurality of cell patterns.

Further, the beam-current adjustment filter may be designed also to function as an aperture for shaping the electron-beam.

By controlling the thickness of the electron-beam absorbent membranes, the beam absorption coefficients of the electron-beam absorbent membranes can be prepared to give a substantially fixed current intensity.

The membranes may also be prepared to give a substantially fixed current intensity by controlling material of the electron-beam absorbent membranes.

Still further, the electron-beam absorbent membranes may be made of meshes of electron-beam absorbent lines, with the width of the electron-beam absorbent lines being less than resolvable width of the electron-beam exposure system, and the beam absorption coefficients of the electron-beam absorbent membranes may be prepared to give the substantially fixed current intensity by controlling fineness of the meshes of the electron-beam absorbent membranes.

BRIEF DESCRIPTION OF THE DRAWINGS

The foregoing, and further objects, features, and advantages of this invention will become more apparent upon consideration of the following description, the appended claims, and the accompanying drawings, wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
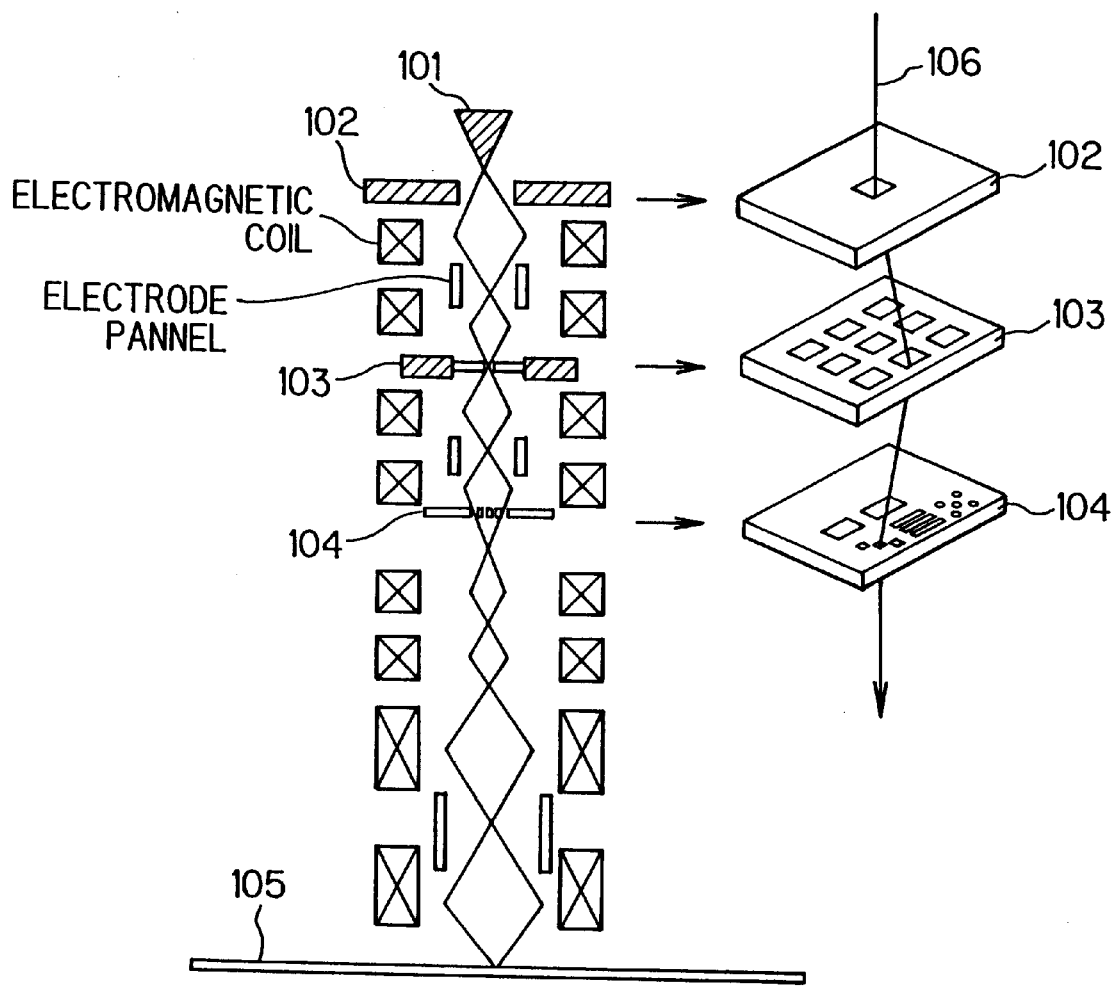
FIG. 1A is a cross section, schematically illustrating an electron-beam exposure system according to a first embodiment of the invention.
FIG. 1B is a perspective view schematically illustrating apertures of the first embodiment of FIG. 1A.

FIG. 1A is a cross section schematically illustrating an electron-beam exposure system according to a first embodiment of the invention, wherein a beam-current adjustment filter 103 is comprised.

Figure 2:
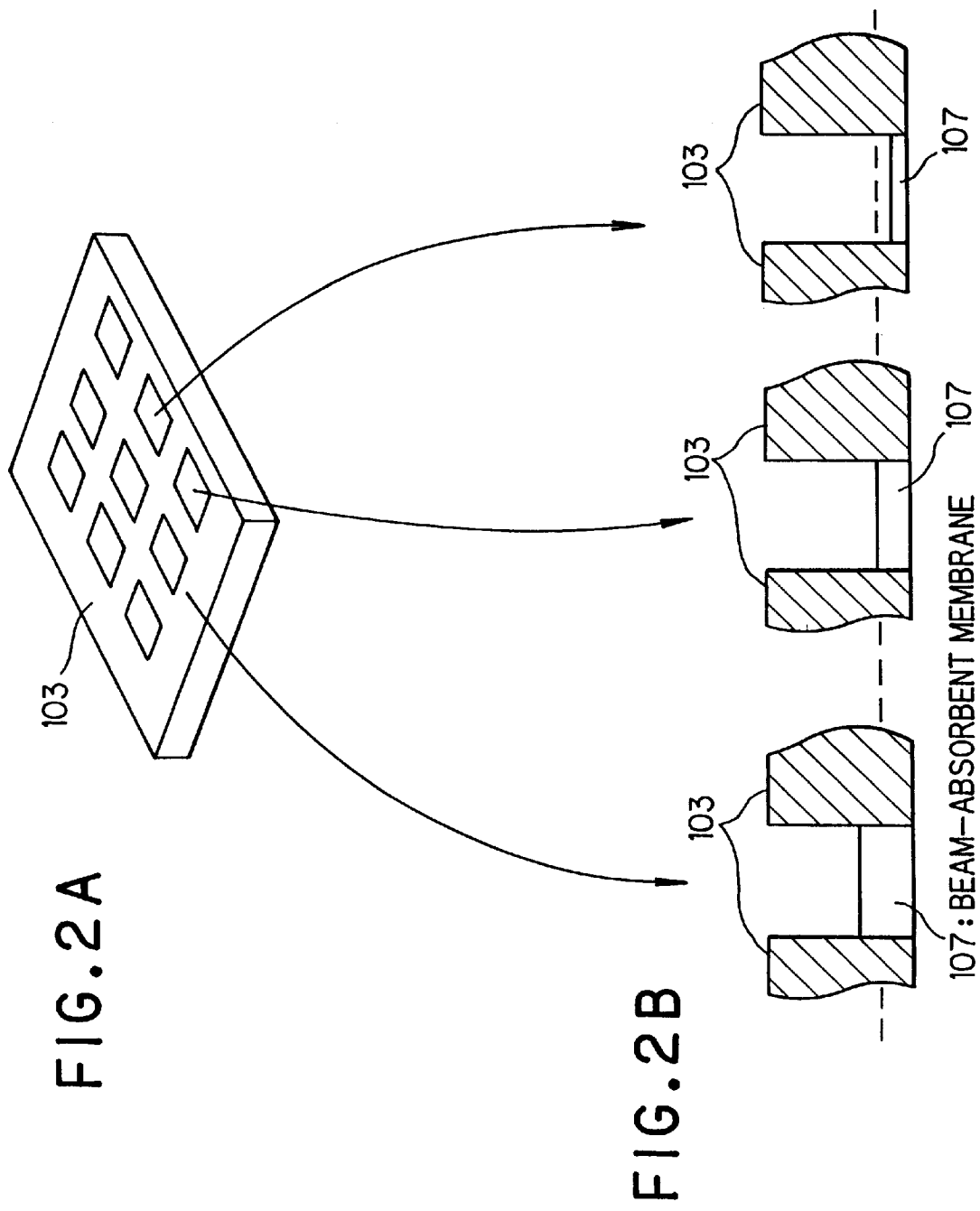
FIG. 2A is a perspective view illustrating the beam-current adjustment filter 103 of FIG. 1B.
FIG. 2B is a partial cross section of the beam-current adjustment filter 103 having beam-absorbent membranes 107.

The beam-current adjustment filter 103 is disposed between a first aperture 102, for shaping an electron beam 101, and a second aperture (EB mask) 104, for patterning the electron beam, as illustrated in FIG. 1A and corresponding perspective view FIG. 1B. The beam-current adjustment filter 103 has a plurality of block filters as shown in FIG. 1B. FIG. 2A is a perspective view illustrating the beam-current adjustment filter 103 and FIG. 2B is a partial cross section of the beam-current adjustment filter 103 illustrating beam-absorbent membranes 107 each having a different thickness for configuring each of the plurality of block filters.

Before preparing the beam-current adjustment filter 103, an appropriate EB current intensity to be irradiated on a wafer 105 of FIG. 1A is measured for focusing the electron beam just on a surface of the wafer 105. Then, beam absorption coefficients, or membrane thicknesses, each giving the appropriate EB current with one shot for each cell pattern of the EB mask 104, are obtained according to open spaces of the cell patterns. The beam absorption coefficients may be calculated from CAD data applied when the EB mask 104 is designed or by measuring EB currents passing through the EB mask 104.

Thus, the beam-current adjustment filter 103 including block filters provided with the beam-absorbent membranes 107 having necessary thicknesses can be prepared.

The beam absorption coefficient of each block filter of the beam-current adjustment filter 103 is controlled by thickness of the beam-absorbent membrane 107, and the thickness is defined by attenuation constant of material used for the membrane 107.

As for the material of the beam-absorbent membrane 107, there can be used metals; such as Al, Ti, Cr, Mo, Pd, Au, W, Pt, Ir, or Tai, monolithic films made of compounds of these matals; or multi-layer films obtained by evaporating these metals on a Si or SiN film. By arranging thicknesses of the beam-absorbent membranes 107 prepared of above materials, beam current passing through the beam-current adjustment filter 103 can be controlled in a range of 30% to 99%.

Figure 3:
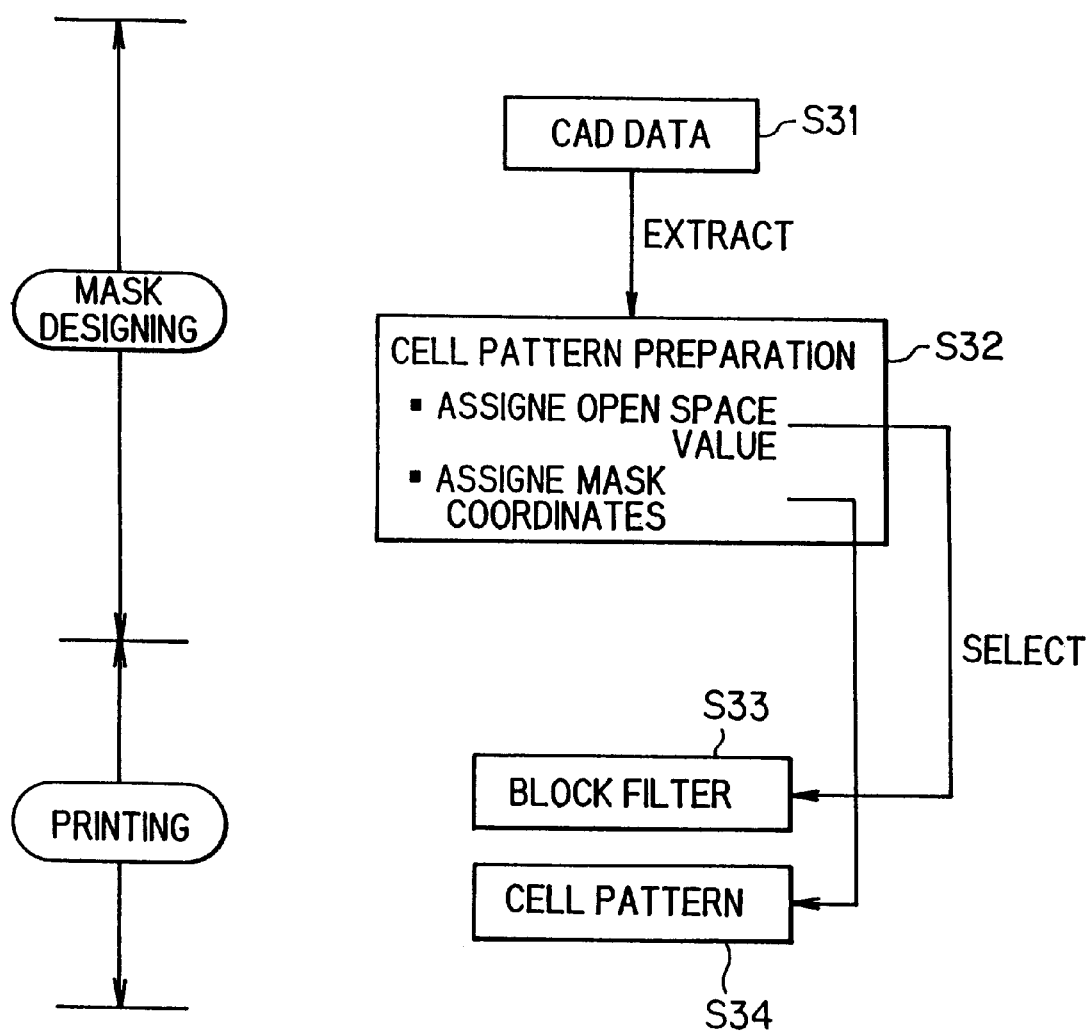
FIG. 3 is a flowchart illustrating an example of steps performed until a block filter having a beam-absorbent membrane 107 of a thickness is selected according to open space of a cell pattern exposed by one shot.

FIG. 3 is a flowchart illustrating an example of steps performed until a block filter having a beam-absorbent membrane 107 of a thickness is selected according to open space of a cell pattern exposed by one shot.

Open space value of a cell pattern in the EB mask 104 is calculated making use of reference data extracted (at step S31) from CAD data used for designing the EB mask 104 and assigned to the cell pattern (at step S32) in a MASK designing procedure, which is followed by a printing process wherein an appropriate block filter is selected (at step S33) to be inserted on EB path referring to open space value assigned to a cell pattern when the cell pattern is selected (at step S34) for a shot of the cell projection. In the example, selection and insertion of the block filter is realized by way of a deflection lens.

In one embodiment, the EB current passing through the EB mask 104 is controlled, so that the EB current intensity irradiated on the wafer 105 has a fixed value independent of open spaces of the cell patterns in the EB mask 104, by selecting one of a block filter from a plurality of block filters having beam absorbent membranes of various thicknesses. When open space of a cell pattern is large, a block filter of a thick membrane is selected to suppress the EB current while a block filter of a thin membrane is selected for a cell pattern of a small open space.

As described above, the EB current intensity exposed on the object material can be maintained at a certain value without changing projection cell sizes or emission current of EB source, in this embodiment, realizing stable and high-quality beam profiles with no degradation of the throughput.

In the above example, the beam-current adjustment filter 103 is described to be disposed between the first aperture 102 for shaping the electron beam 401 and the second aperture (EB mask) 104 for patterning the electron beam. However, the beam-current adjustment filter 103 may be disposed anywhere, above or below the EB mask 104, on the condition it crosses the electron-beam path.

Further, the beam-current adjustment filter 103 of this embodiment is designed to have block filters having beam-absorbent membranes 107 of various thicknesses. However, by preparing certain numbers of beam-current adjustment filters each having a beam-absorbent membrane of a certain thickness or different, thickness, the EB current intensity may be controlled by inserting an appropriate combination sub-selected among the certain numbers of beam-current adjustment filters so as to overlap on the EB path for giving a necessary beam-absorption coefficient according to the open space of the cell pattern exposed by one shot. This method has a merit of ease in preparation of the beam-adjustment filters.

Now, a second embodiment of the electron-beam exposure system according to the invention will be described, wherein the beam-current adjustment filter 103 and the second aperture (EB mask) 104 for patterning the electron beam 101 of the first embodiment are unitized.

Figure 4:
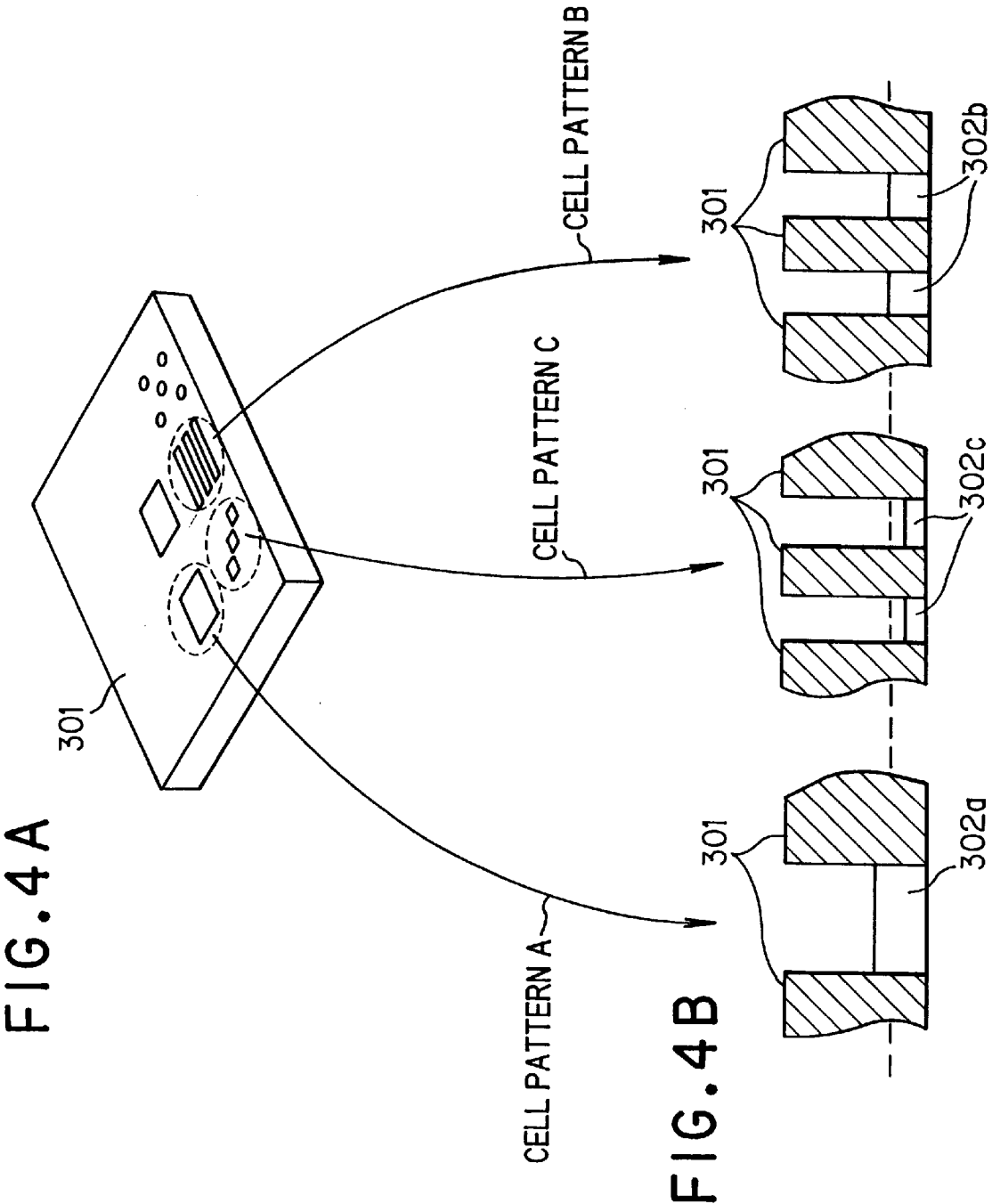
FIG. 4A is a perspective view illustrating an EB mask 301 of the second embodiment having the function of a beam-current adjustment filter.
FIG. 4B is a partial cross section of the EB mask 301 having beam-absorbent membranes 302a to 302c.

FIG. 4A is a perspective view illustrating an EB mask 301 of the second embodiment having the function of a beam-current adjustment filter, and FIG. 4B is a partial cross section of the EB mask 301 illustrating beam-absorbent membranes 302a to 302c, each membrane provided for each cell pattern with different thickness.

When configuring the EB mask 301, each of the beam-absorbent membranes 302a to 302c is formed traversing open space of each of the cell patterns, the beam absorption coefficient thereof prepared according to the open space rate of each cell pattern at issue. That is, thickness of each of the beam-absorbent membranes 302a to 302c is configured to have the beam absorption coefficient calculated to be appropriate for the open space of each cell pattern, referring to the open space value obtained from CAD data in the same way as the beam-current adjustment filter 103 of FIG. 2B.

For example, when the cell pattern at issue has a large open space as cell pattern A of FIGS. 4A and 4B, a thick beam-absorbent membrane 302a is configured traversing the open space, while a thin beam-absorbent membrane 302c is configured for a cell pattern C having a small open space.

According to the second embodiment, when a cell pattern is selected, a necessary attenuation filter can be selected at the same time. Therefore, there is an additional merit, besides those of the first embodiment, that means for and processes of selecting a block filter according to a selected cell pattern can be eliminated, enabling still higher throughput in the lithography processes with more simple composition of the EB exposure system.

Further, the beam-current adjustment filter 103 of the first embodiment may be unitized with the first aperture 102 of FIG. 1B for shaping the electron-beam.

Figure 5:
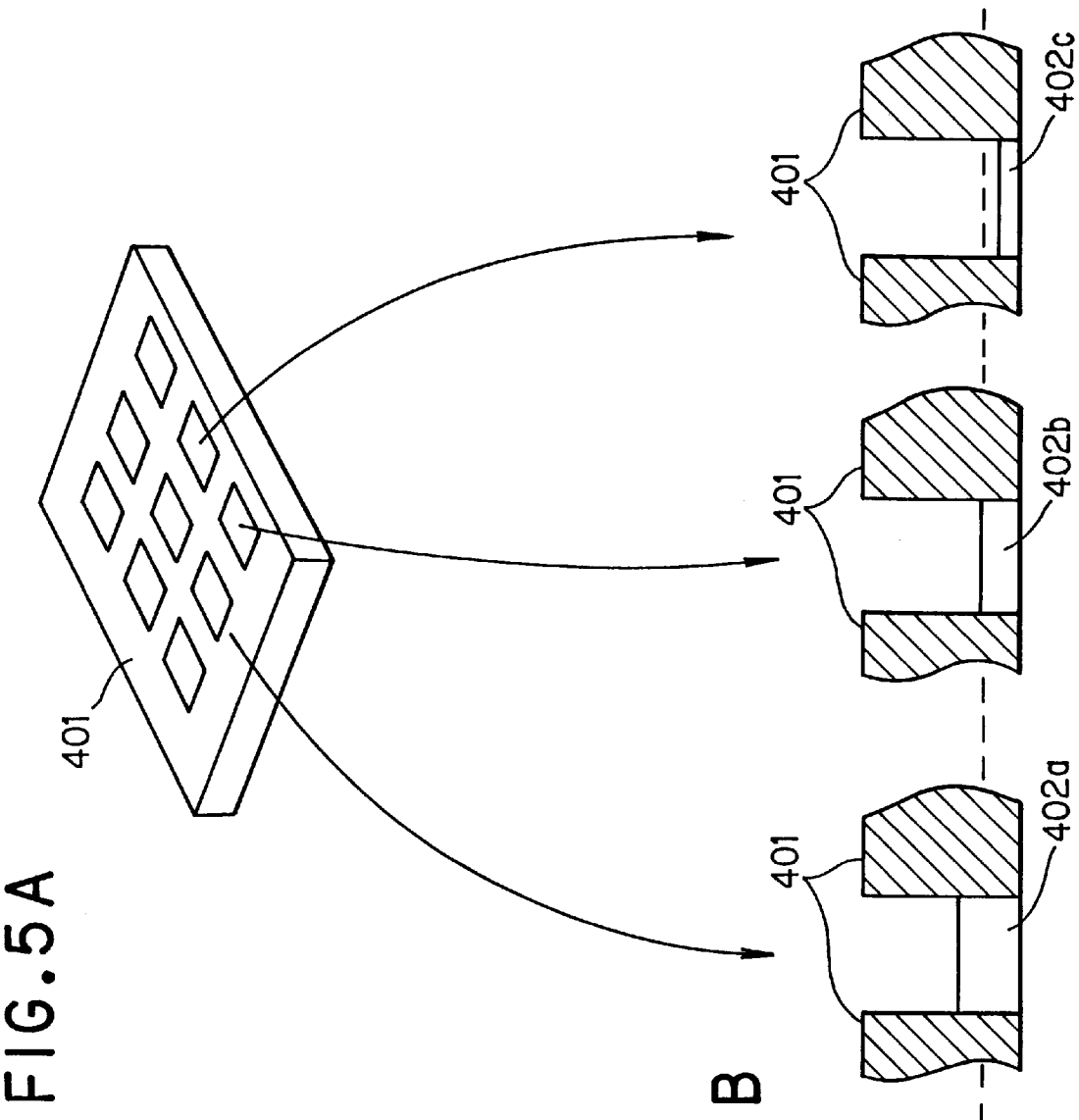
FIG. 5A is a perspective view illustrating an first aperture 401 of a third embodiment having the function of a beam-current adjustment filter.
FIG. 5B is a partial cross section of the first aperture 401 having beam-absorbent membranes 402a to 402c.

FIG. 5A is a perspective view illustrating an first aperture 401 of a third embodiment having the function of a beam-current adjustment filter, and FIG. 5B is a partial cross section of the first aperture 401 illustrating beam-absorbent membranes 402a to 402c, each membrane provided for each of block apertures from different thickness with each other.

As shown in FIG. 5A, certain numbers of block apertures are provided in the first aperture 401. The opening of each block aperture has the same size as the opening of the first aperture 102 of FIG. 1B. That is, the first aperture 401 of the third embodiment for shaping the electron-beam can be said to be replaced with the beam-current adjustment filter 103 of FIG. 2A wherein the size of block filters is to be the same as the opening of the first aperture 102 of FIG. 1B, which call be prepared in the same way with the beam-current adjustment filter 103 of FIG. 2A, duplicated descriptions being omitted.

In the third embodiment, an appropriate block aperture of the first aperture 401 is selected, instead of a block filter of the beam-current adjustment filter 103 of the first embodiment, according to the cell pattern selected for a projection shot.

In the EB exposure system according to the third embodiment, system composition can be simplified by substantially eliminating the first aperture 102 of the first embodiment, and there is a merit of ease in preparation of the beam-current adjustment filter (EB mask) compared to the second embodiment.

In the above first to the third embodiments, the beam absorption coefficient is adjusted by controlling thickness of the EB absorbent membrane. However, it may be adjusted by preparing the EB absorbent membrane with different materials.

Figure 6:
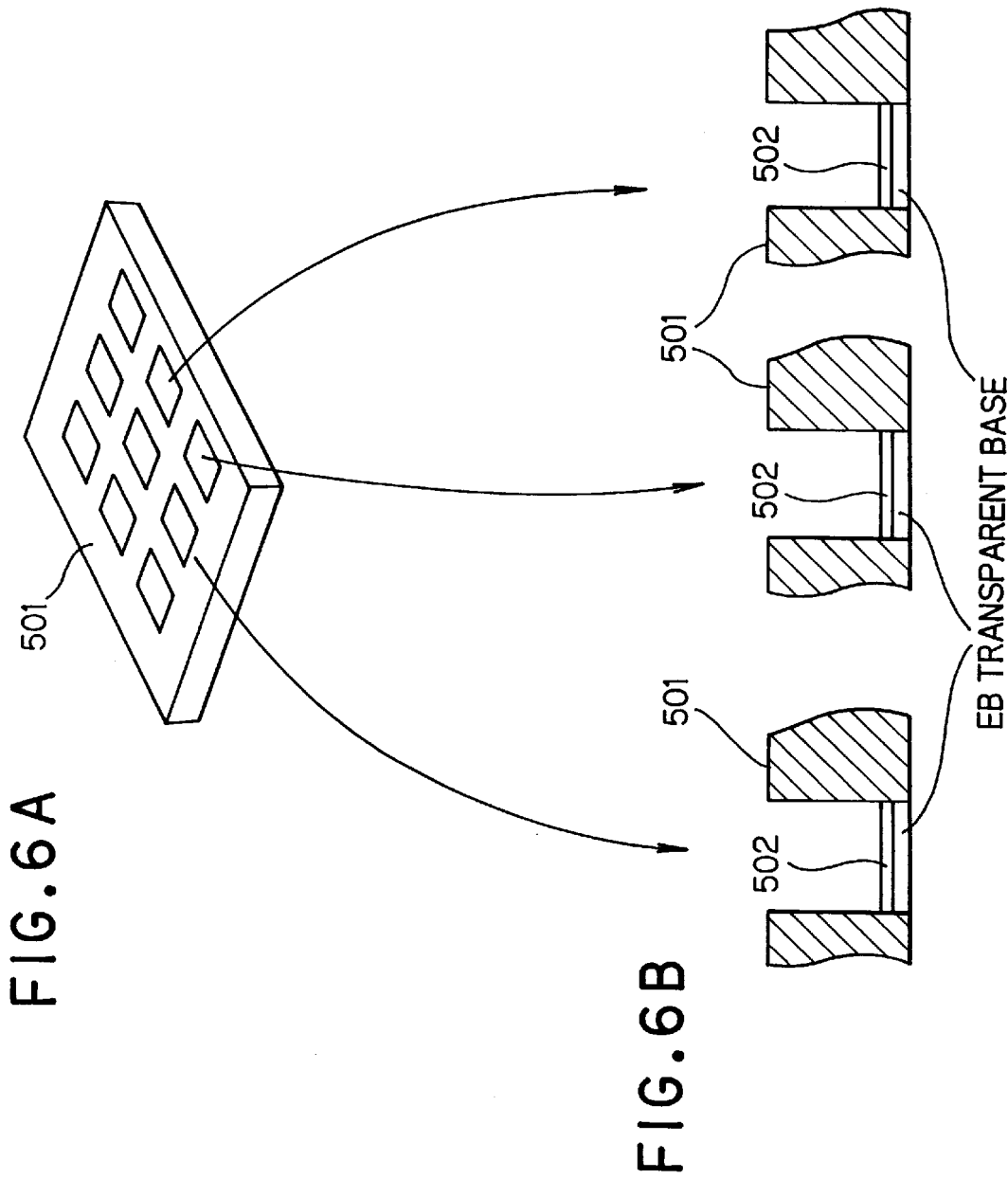
FIG. 6A is a perspective view illustrating an beam-current adjustment filter 501 of a fourth embodiment having certain numbers of block filters.
FIG. 6B is a partial cross section of the beam-current adjustment filter 501 having the block filters therein configured EB absorbent membranes 502.

FIG. 6A is a perspective view illustrating a beam-current adjustment filter 501 of a fourth embodiment having certain members of block filters, and FIG. 6B is a partial cross section of the beam-current adjustment filter 501 illustrating the block filters wherein are configured EB absorbent membranes 502.

Traversing each of the block filters of the beam-current adjustment filter 501, an EB absorbent membrane 502 made of metals, semiconductors, or their compounds is formed by way of spattering, evaporation or CVD (Chemical Vapor Deposition) method. For example, a high EB absorbent membrane can be obtained by forming an absorbent film made of metals, such as Mo, Ru, Pd, Au, W, Pt, Ir, Ta or their compounds on an EB transparent base made of transparent materials such as C, Al, Si or SiN, while absorbent film made of metals such as Al, Ti, Cr, Ni, Fe, Mn, Cu or their compounds give a low EB absorbent membrane compared to former materials including Mo.

By mixing high EB absorbent materials and low EB absorbent materials with an appropriate rate (density), an EB absorbent membrane having a desired beam absorption coefficient can be obtained.

The EB absorbent membrane 502 thus prepared may be applied to the second or the third embodiment, as well as to the first embodiment, and has a merit that EB absorbent membranes having beam absorption coefficients of a wide range and a fine step can be easily prepared by controlling both their materials and their thicknesses.

Still further, a mesh as sufficiently fine as not to be resolved by the exposure system may be applied to the beam-current adjustment filter in place of the EB absorbent membrane.

Figure 7:
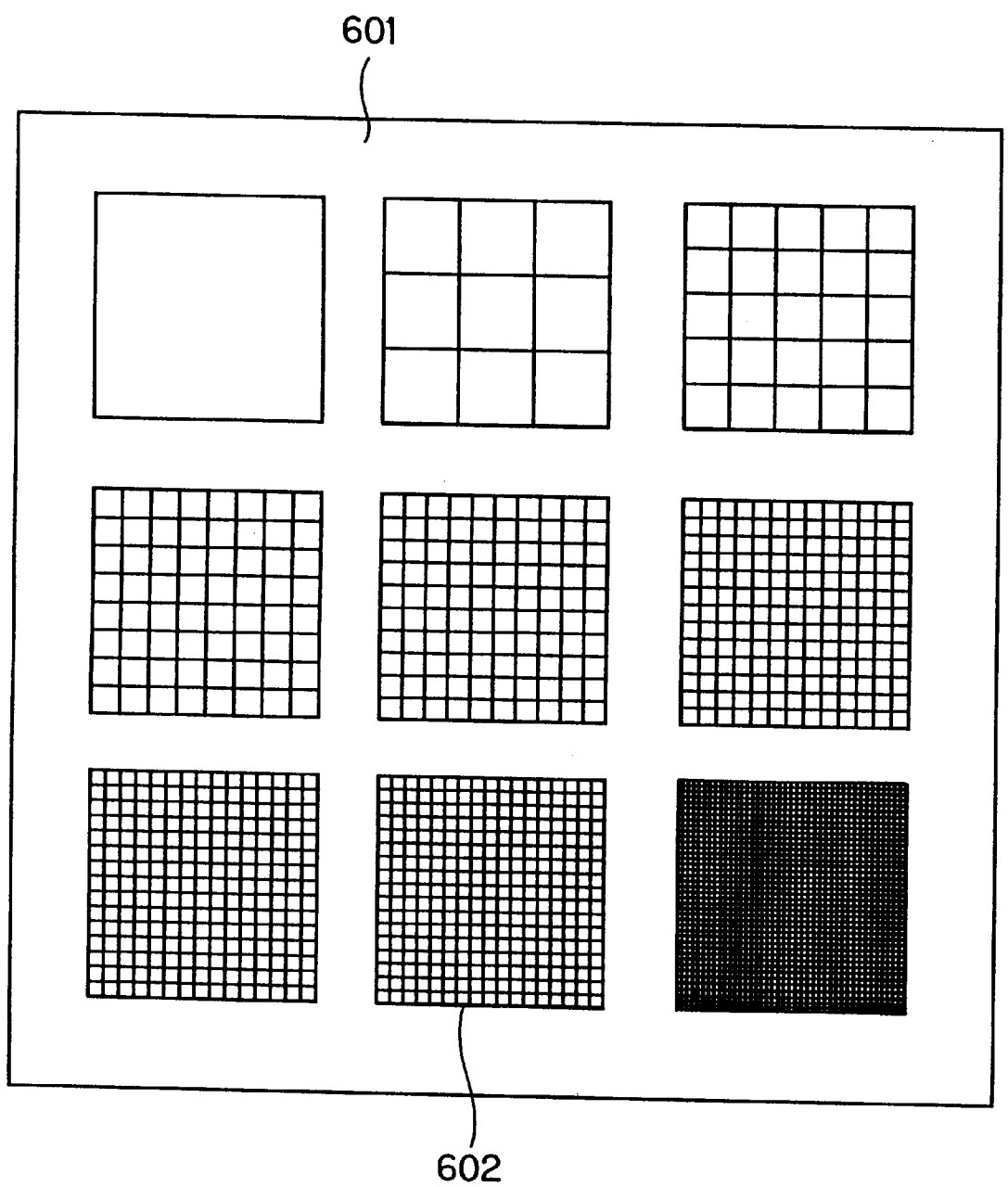
FIG. 7 is a schematic diagram illustrating a beam-current adjustment filter 601 according to a fifth embodiment of the invention.
Figure 8:
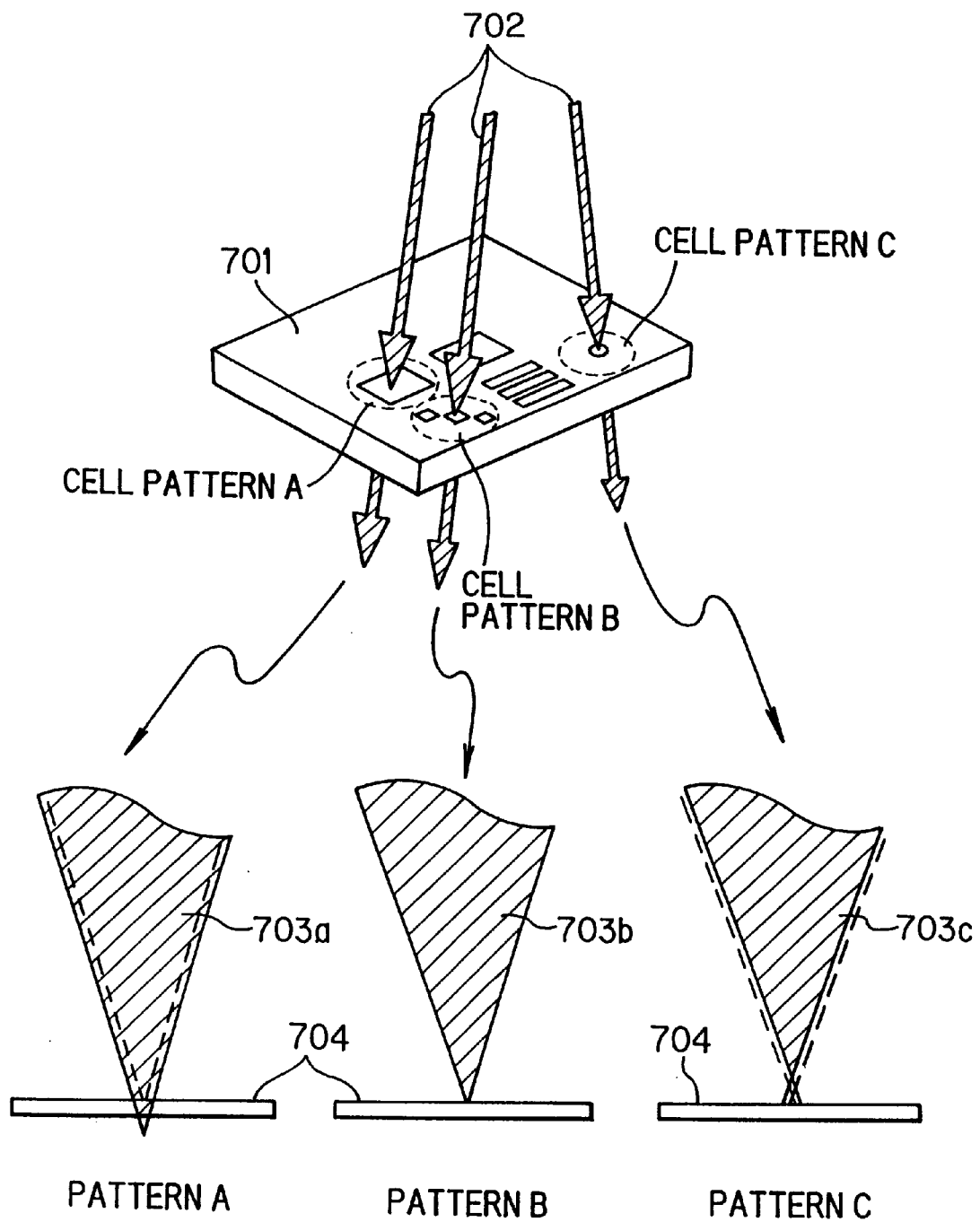
FIG. 8 is a schematic diagram illustrating focus deviation according to the EB current intensity.
Figure 9:
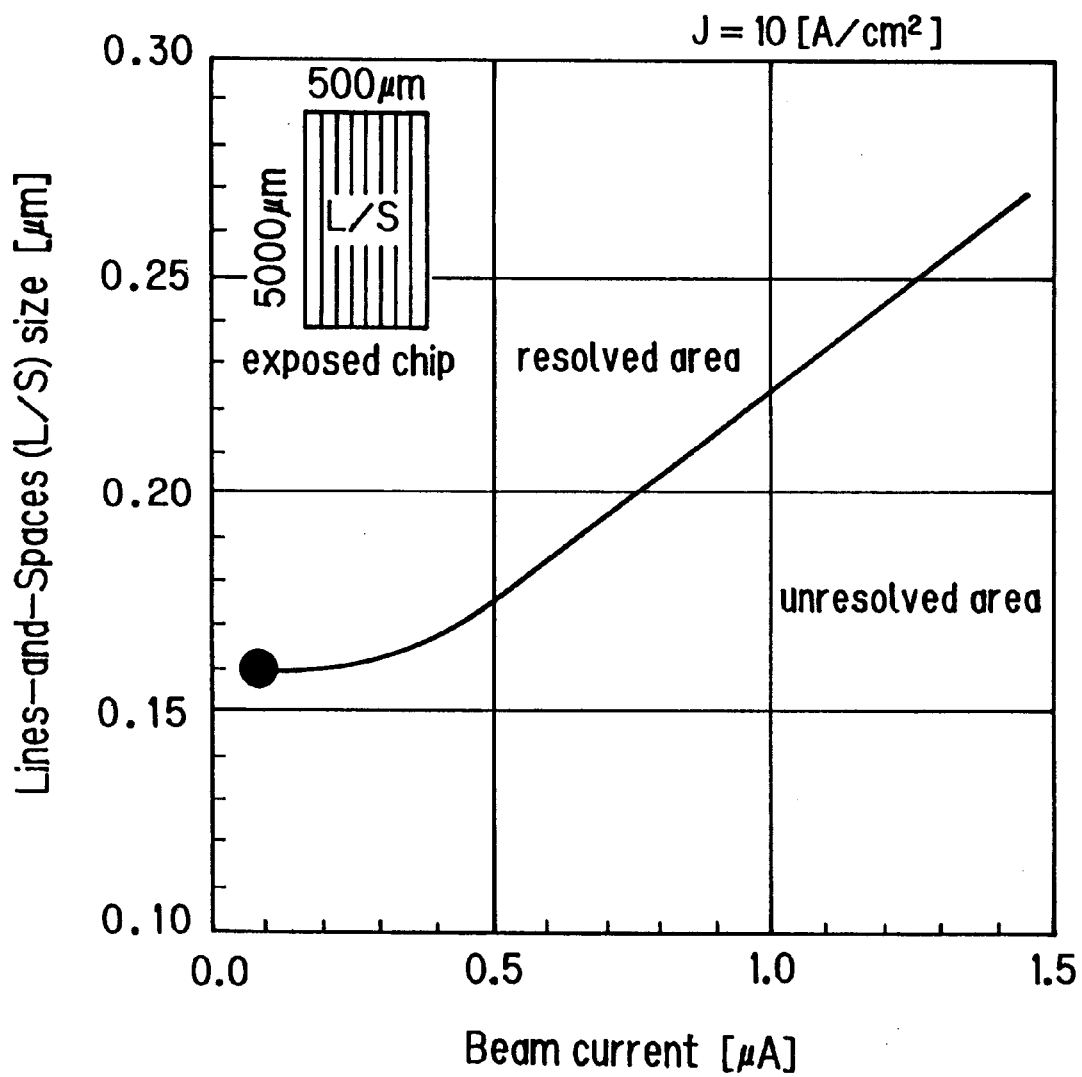
FIG. 9 is a characteristic chart illustrating a relationship between pattern resolution limit, represented by Lines-and-Spaces (L/S) size, and the EB current.
Figure 10:
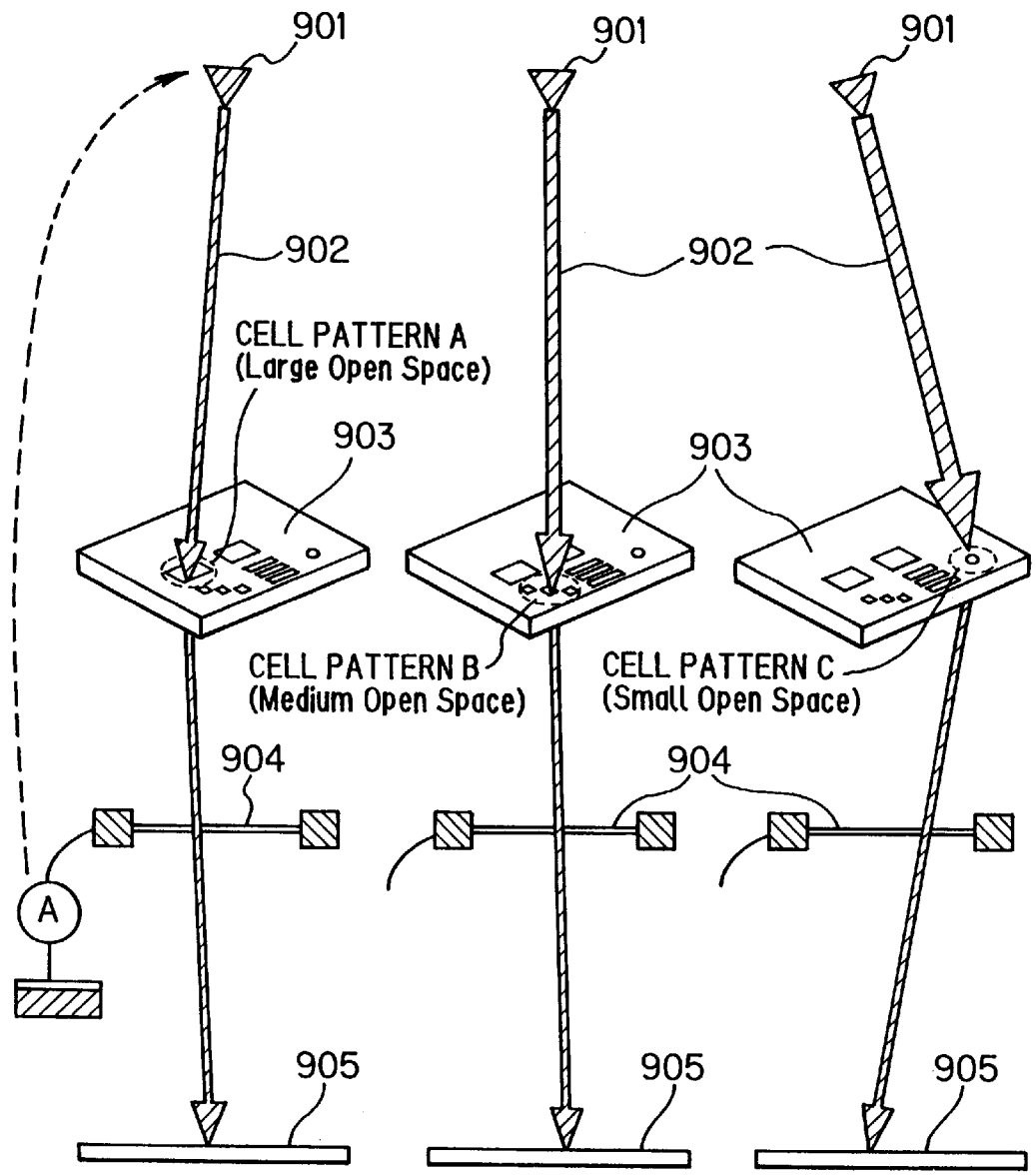
FIG. 10 is a schematic diagram illustrating application of the prior method to the cell projection lithography.

FIG. 7 is a schematic diagram illustrating a beam-current adjustment filter 601 according to a fifth embodiment of the invention.

The beam-current adjustment filter 601 comprises a certain number of block filters, each provided with a mesh prepared of material which is somewhat EB absorbent.

Si, SiN, metals such as Al, Ti, Cr, Mo, Pd, Au, W, Pt, Ir, Ta or their compounds may be applied to the mesh 602.

Line width of the mesh 602 is determined within a value not to be resolved by the EB exposure system and mesh fineness (size of each grid) thereof is controlled, rather than thickness of the EB absorbent membrane as in former embodiments. As to the line width, unresolvable size on the wafer surface is within 0.05 $\mu$m when the EB current irradiated on the wafer is 5 $\mu$A. Therefore, the line width of each of the meshes 602 of the beam-current adjustment filter 601 may be determined within 3 $\mu$m when magnification of the object lens is ×60.

By controlling the open space of each block filter with the fineness of the mesh 602 as shown in FIG. 7, and selecting an appropriate one of the block filters according to the open space of the cell pattern selected for a projection shot, that is, a fine mesh for a light cell pattern and a coarse mesh for a dark cell pattern, the EB current intensity can be maintained in a desired range.

The mesh 602 of the fifth embodiment can be also applied to the second or the third embodiment, as well as to the first embodiment.

As heretofore described, according to the electron-beam exposure system of the invention and the method applied therein, the EB current to be probed on a wafer surface can be controlled into a fixed value with a simple process, without needing to prepare various shot sizes or to change emission current of the electron-beam source, realizing high-quality cell projection lithography with the stable and constant EB current and a high throughput, without needing standby time for the beam-current stabilization or the cell pattern dividing.

What is claimed is:

1. An electron-beam exposure system having an electron-beam mask including a plurality of cell patterns used for cell projection lithography, said electron-beam exposure system comprising:

a beam current adjustment filter having a certain number of electron-beam absorbent membranes to be positioned in a path of an electron-beam projected through one of the plurality of cell patterns and irradiated on an object material, wherein, each of said electron-beam absorbent membranes comprises a solid material layer, spanning from a first side of an aperture through which the electron beam is projected to a second side of said aperture to cover an open area of said aperture in its entirety; beam absorption coefficients of the electron-beam absorbent membranes being prepared to give a substantially fixed current intensity of the electron-beam irradiated on the object material for each of the plurality of cell patterns by considering open space of each of the plurality of cell patterns.

2. The electron-beam exposure system recited in claim 1, wherein the beam-current adjustment filter is integrated in the electron-beam mask by configuring the electron-beam absorbent membranes to traverse open space of the plurality of cell patterns.

3. The electron-beam exposure system recited in claim 1, wherein the beam-current adjustment filter also functions as an aperture for shaping the electron-beam.

4. The electron-beam exposure system recited in claim 1, wherein the beam absorption coefficients of the electron-beam absorbent membranes are prepared to give the substantially fixed current intensity by controlling thickness of the electron-beam absorbent membranes.

5. An electron-beam exposure system having an electron-beam mask including a plurality of cell patterns used for cell projection lithography, said electron-beam exposure system comprising:

a beam-current adjustment filter having a holder provided with a certain number of block filters, each having an electron-beam absorbent membrane; and a block-filter selection means for selecting at least one of the block filters to be positioned in a path of an electron-beam projected through one of the plurality of cell patterns and irradiated on an object material, wherein, each of said electron-beam absorbent membranes comprises a solid material layer, spanning from a first side of an aperture through which the electron beam is projected to a second side of said aperture to cover an open area of said aperture in its entirety;

a beam-current absorption coefficient of the electron-beam absorbent membrane of each of said at least one of the block filters giving, in total, a substantially fixed current intensity of the electron-beam irradiated on the object material by being prepared considering open space of said one of the plurality of cell patterns.

6. The electron-beam exposure system recited in claim 5, wherein the beam-current adjustment filter also functions as an aperture for shaping the electron-beam.

7. The electron-beam exposure system recited in claim 5, wherein the beam absorption coefficients of the electron-beam absorbent membranes are prepared to give the substantially fixed current intensity by controlling thickness of the electron-beam absorbent membranes.

8. An electron-beam exposure system having an electron-beam mask including a plurality of cell patterns used for cell projection lithography said electron-beam exposure system comprising:

a beam current adjustment filter having a certain number of electron-beam absorbent membranes to be positioned in a path of an electron-beam projected through one of the plurality of cell patterns and irradiated on an object material, beam absorption coefficients of the electron-beam absorbent membranes being prepared to give a substantially fixed current intensity of the electron-beam irradiated on the object material for each of the plurality of cell patterns by considering open space of each of the plurality of cell patterns, wherein the beam absorption coefficients of the electron-beam absorbent membranes are prepared to give the substantially fixed current intensity by controlling material of the electron-beam absorbent membranes.

9. An electron-beam exposure system, having an electron-beam mask including a plurality of cell patterns used for cell projection lithography, said electron-beam exposure system comprising:

a beam-current adjustment filter having a holder provided with a certain number of block filters, each having an electron-beam absorbent membrane; and a block-filter selection means for selecting at least one of the block filters to be positioned in a path of an electron-beam projected through one of the plurality of cell patterns and irradiated on an object material, a beam-current absorption coefficient of the electron-beam absorbent membrane of each of said at least one of the block filters giving, in total, a substantially fixed current intensity of the electron-beam irradiated on the object material by being prepared considering open space of said one of the plurality of cell patterns, wherein the beam absorption coefficients of the electron-beam absorbent membranes are prepared to give the substantially fixed current intensity by controlling material of the electron-beam absorbent membranes.

10. An electron-beam exposure system having an electron-beam mask including a plurality of cell patterns used for cell projection lithography, said electron-beam exposure system comprising:

a beam current adjustment filter having a certain number of electron-beam absorbent membranes to be positioned in a path of an electron-beam projected through one of the plurality of cell patterns and irradiated on an object material, beam absorption coefficients of the electron-beam absorbent membranes being prepared to give a substantially fixed current intensity of the electron-beam irradiated on the object material for each of the plurality of cell patterns by considering open space of each of the plurality of cell patterns, wherein the electron-beam absorbent membranes are made of meshes of electron-beam absorbent lines, width of the electron-beam absorbent lines being less than resolvable width of the electron-beam exposure system; and the beam absorption coefficients of the electron-beam absorbent membranes are prepared to give the substantially fixed current intensity by controlling fineness of the meshes of the electron-beam absorbent membranes, said membranes formed from a material including at least one of Al, Ti, Cr, Mo, Pd, Au, Pt, Ir, W and Ta.

11. An electron-beam exposure system, having an electron-beam mask including a plurality of cell patterns used for cell projection lithography, said electron-beam exposure system comprising:

a beam-current adjustment filter having a holder provided with a certain number of block filters, each having an electron-beam absorbent membrane; and a block-filter selection means for selecting at least one of the block filters to be positioned in a path of an electron-beam projected through one of the plurality of cell patterns and irradiated on an object material, a beam-current absorption coefficient of the electron-beam absorbent membrane of each of said at least one of the block filters giving, in total, a substantially fixed current intensity of the electron-beam irradiated on the object material by being prepared considering open space of said one of the plurality of cell patterns wherein the electron-beam absorbent membranes are made of meshes of electron-beam absorbent lines, width of the electron-beam absorbent lines being less than resolvable width of the electron-beam exposure system; and the beam absorption coefficients of the electron-beam absorbent membranes are prepared to give the substantially fixed current intensity by controlling fineness of the meshes of the electron-beam absorbent membranes, said membranes formed from a material including at least one of Al, Ti, Cr, Mo, Pd, Au, Pt, Ir, W and Ta.

12. A method of electron-beam exposure to be applied to cell projection lithography making use of a plurality of cell patterns; said method comprising steps of:

preparing a beam-current adjustment filter having a certain number of electron-beam absorbent membranes;

selecting a most appropriate combination, including at least one of the electron-beam absorbent membranes to be positioned in a path of an electron-beam to be projected through one of the plurality of cell patterns and irradiated on an object material considering open space of said one of the plurality of cell patterns, a beam-absorbent coefficient of each of the combination giving, in total, a substantially fixed current intensity of the electron-beam irradiated on the object material; and projecting the electron-beam through said one of the plurality of cell patterns and the combination of the electron-beam absorbent membranes, wherein, each of said electron-beam absorbent membranes comprises a solid material layer, spanning from a first side of an aperture through which the electron beam is projected to a second side of said aperture to cover an open area of said aperture in its entirety.

* * * * *

UNITED STATES PATENT AND TRADEMARK OFFICE
CERTIFICATE OF CORRECTION

PATENT NO.: 6,034,376
DATED: March 7, 2000
INVENTOR(S): Takahiro EMA

It is certified that error(s) appears in the above-identified patent and that said Letters Patent is hereby corrected as shown below:

Column 2, line 63, delete "best" insert --beam--.

Column 3, line 18, delete "bean" insert --beam--.

Column 4, line 66, delete "Tai," insert --$Ta_j$--;

line 67, delete "matals" insert --metals--.

Column 5, line 39, delete "401" insert 101--.

Column 6, line 31, delete "with" insert --from--;

line 41, delete "call" insert --can--;

line 62, delete "members" insert --numbers--.

Signed and Sealed this

Twenty-fourth Day of April, 2001

NICHOLAS P. GODICI

*Attest:*

*Attesting Officer*

*Acting Director of the United States Patent and Trademark Office*